United States Patent
Jiang

(10) Patent No.: US 9,794,001 B2
(45) Date of Patent: Oct. 17, 2017

(54) OPTICAL RECEIVER WITH MULTIPLE TRANSIMPEDANCE AMPLIFIERS

(71) Applicant: Fujitsu Limited, Kawasaki-shi, Kanagawa (JP)

(72) Inventor: Jian Hong Jiang, Los Altos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/990,723

(22) Filed: Jan. 7, 2016

(65) Prior Publication Data
US 2017/0201327 A1    Jul. 13, 2017

(51) Int. Cl.
*H04B 10/61*   (2013.01)
*H03F 3/45*    (2006.01)

(52) U.S. Cl.
CPC ....... *H04B 10/616* (2013.01); *H03F 3/45645* (2013.01); *H03F 2200/453* (2013.01); *H03F 2203/45288* (2013.01)

(58) Field of Classification Search
CPC combination set(s) only.
See application file for complete search history.

(56) References Cited

U.S. PATENT DOCUMENTS

| | | | | |
|---|---|---|---|---|
| 2005/0232637 A1* | 10/2005 | Paillet | ............... | H04B 10/66 398/140 |
| 2010/0054758 A1* | 3/2010 | Ereifej | ............... | H04B 10/296 398/202 |
| 2013/0121707 A1* | 5/2013 | Ossieur | ............... | H03G 3/3073 398/209 |
| 2013/0127535 A1* | 5/2013 | Kucharski | ............... | H03F 3/08 330/254 |
| 2013/0294546 A1* | 11/2013 | Emami-Neyestanak | . | H03F 1/08 375/319 |
| 2015/0338269 A1* | 11/2015 | Frank | ............... | G01J 1/18 250/208.2 |

OTHER PUBLICATIONS

T. Takemoto et al., "A 25 Gb/s × 4-channel 74 mW/ch Transimpedance Amplifier in 65 nm CMOS," IEEE, 978-1-4244-5760-1/10; 4 pages, 2010.

* cited by examiner

*Primary Examiner* — David Payne
*Assistant Examiner* — Omar S Ismail
(74) *Attorney, Agent, or Firm* — Baker Botts L.L.P.

(57) ABSTRACT

A method and system for amplifying small optical currents in an optical receiver front end system may employ multiple transimpedance amplifiers (TIAs) and feedback control loops. For example, the front end system may include a main feedback control loop (having a main TIA) and a replica feedback control loop (having a replica TIA) that, collectively, generate an optimum input common mode level for a differential amplifier operating at high data rates (e.g., speeds up to tens of gigabits per second). The replica TIA may track the noise from the power supply of the optical receiver in the substantially same manner as the main TIA. Therefore, the differential signals produced by the main control loop may not be degraded at the input to the high-speed differential amplifier. The outputs of the high-speed differential amplifier may be symmetric about the common mode level and may be suitable inputs for voltage sampling.

17 Claims, 10 Drawing Sheets

OPTICAL RECEIVER WITH MULTIPLE TRANSIMPEDANCE AMPLIFIERS

BACKGROUND

Field of the Disclosure

The present disclosure relates generally to optical communication networks and, more particularly, to an optical receiver that includes multiple transimpedance amplifiers and a feedback control loop.

Description of the Related Art

Telecommunication, cable television and data communication systems use optical networks to rapidly convey large amounts of information between remote points. In an optical network, information is conveyed in the form of optical signals through optical fibers. Optical fibers may comprise thin strands of glass capable of communicating the signals over long distances. Optical networks often employ modulation schemes to convey information in the optical signals over the optical fibers. Such modulation schemes may include phase-shift keying (PSK), frequency-shift keying (FSK), amplitude-shift keying (ASK), pulse-amplitude modulation (PAM), and quadrature amplitude modulation (QAM).

Optical networks may also include various optical elements, such as amplifiers, dispersion compensators, multiplexer/demultiplexer filters, wavelength selective switches (WSS), optical switches, couplers, etc. to perform various operations within the network. In particular, optical networks may include optical-electrical-optical (O-E-O) regeneration at reconfigurable optical add-drop multiplexers (ROADMs) when the reach of an optical signal is limited in a single optical path.

As data rates for optical networks continue to increase, reaching up to 1 terabit/s (1 T) and beyond, the demands on optical signal-to-noise ratios (OSNR) also increase. High-speed optical receivers might include a photo detector that senses the incoming analog optical power and converts it into electrical current. In order to convert such a small current into a large voltage, some optical receivers include a circuit commonly referred to as a transimpedance amplifier (TIA).

SUMMARY

In one aspect, a disclosed optical receiver includes a photo detector, a transimpedance amplifier, a replica transimpedance amplifier, and a first differential amplifier. The photo detector may convert an optical signal into a first electrical current signal. The transimpedance amplifier may receive, as input, the first electrical current signal, and may output a first voltage signal having a first DC component. The replica transimpedance amplifier may receive, as input, a second electrical current signal, and may output a second voltage signal. The first DC component of the first voltage signal and a second DC component of the second voltage signal may be substantially equal. The first differential amplifier may receive, as inputs from the transimpedance amplifier and the replica transimpedance amplifier, the first voltage signal and the second voltage signal, respectively, and may output a pair of output voltage signals that are symmetric about a common mode voltage.

In any of the disclosed embodiments, the optical receiver may include a voltage sampler. The pair of output voltage signals output by the first differential amplifier may be inputs to the voltage sampler.

In any of the disclosed embodiments of the optical receiver, the transimpedance amplifier and the replica transimpedance amplifier may be inverter-based resistive feedback amplifiers.

In any of the disclosed embodiments of the optical receiver, the photo detector may be a photodiode.

In any of the disclosed embodiments of the optical receiver, the replica transimpedance amplifier may be included in a replica feedback control loop. The replica feedback control loop may also include a second differential amplifier to receive, as inputs, the output of the replica transimpedance amplifier and a reference voltage.

In any of the disclosed embodiments of the optical receiver, the replica feedback control loop may cause a common mode voltage of the output of the replica transimpedance amplifier to match the reference voltage.

In any of the disclosed embodiments of the optical receiver, the value of the reference voltage may control whether the second differential amplifier operates in a linear gain region.

In any of the disclosed embodiments of the optical receiver, the replica feedback control loop may also include a transistor to operate as a switch current source. The second electrical current signal may be provided by the switch current source.

In any of the disclosed embodiments of the optical receiver, the transimpedance amplifier may be included in a main feedback control loop. The main feedback control loop may also include a third differential amplifier to receive, as input signals, the pair of output voltage signals output by the first differential amplifier, and to amplify the received input signals.

In any of the disclosed embodiments of the optical receiver, the main feedback control loop may cause the output of the transimpedance amplifier to follow the output of the replica transimpedance amplifier.

In a further aspect, a disclosed method is for optical communication. The method may include, in a main feedback control loop, receiving, by a transimpedance amplifier as input from a photo detector, a first electrical current signal representing an optical signal, and outputting, by the transimpedance amplifier, a first voltage signal. The method may include, in a replica feedback control loop, receiving, by a replica transimpedance amplifier as input, a second electrical current signal, and outputting, by the replica transimpedance amplifier, a second voltage signal. A first DC component of the first voltage signal and a second DC component of the second voltage signal may be substantially equal. The method may include, in the main feedback control loop, receiving, by a first differential amplifier circuit as inputs from the transimpedance amplifier circuit and the replica transimpedance amplifier circuit, the first voltage signal and the second voltage signal, respectively, and outputting, by the first differential amplifier circuit, a pair of output voltage signals that are symmetric about a common mode voltage.

In any of the disclosed embodiments, the method may include, in a voltage sampler, receiving, as input signals, the pair of output voltage signals, sampling the input signals, and determining, dependent on the sampling, information encoded in the optical signal.

In any of the disclosed embodiments, the method may include, in the replica feedback control loop, receiving, by a second differential amplifier as inputs, the output of the replica transimpedance amplifier and a reference voltage, and causing a common mode voltage of the output of the replica transimpedance amplifier to match the reference voltage.

In any of the disclosed embodiments, the method may include, in the main feedback control loop, receiving, by a third differential amplifier as inputs, the pair of output voltage signals output by the first differential amplifier, and causing the output of the transimpedance amplifier to follow the output of the replica transimpedance amplifier.

In any of the disclosed embodiments of the method, the photo detector may be, or include, a photodiode or a phototransistor.

In any of the disclosed embodiments of the method, the transimpedance amplifier and the replica transimpedance amplifier may be, or include, operational amplifiers.

In yet another aspect, a disclosed method is for designing an optical receiver. The method may include designing an inverter-based resistive feedback amplifier. The method may include designing a first differential amplifier for operation at data rates up to multiple gigabits per second. The method may include designing a second differential amplifier for operation at data rates lower than those at which the first differential amplifier operates. The method may include designing a third differential amplifier for operation at data rates lower than those at which the first differential amplifier operates. The method may include designing a feedback control loop including the inverter-based resistive feedback amplifier, the first differential amplifier, and the second differential amplifier. The method may include designing a replica feedback control loop including a replica of the inverter-based resistive feedback amplifier and the third differential amplifier. An output of the inverter-based resistive feedback amplifier and an output of the replica of the inverter-based resistive feedback amplifier may be inputs to the first differential amplifier. The feedback control loop may be designed such that, once settled, it causes the output of the inverter-based resistive feedback amplifier to follow the output of the replica of the inverter-based resistive feedback amplifier.

In any of the disclosed embodiments of the method, designing the replica feedback control loop may include choosing a common mode selector reference voltage for input to the third differential amplifier. The replica feedback control loop may be designed such that, once settled, it causes a common mode voltage of the output of the replica of the inverter-based resistive feedback amplifier to match the common mode selector reference voltage.

In any of the disclosed embodiments, the method may include determining whether the feedback control loop is stable over a wide range of processes, voltages, temperatures, and common mode selector reference voltages, and in response to determining that the feedback control loop is not stable over a wide range of processes, voltages, temperatures, or common mode selector reference voltages, modifying the design of the feedback control loop to improve stability. Modifying the design may include modifying a structure, an input, or an operating parameter of one or more of the inverter-based resistive feedback amplifier, the first differential amplifier, or the second differential amplifier.

In any of the disclosed embodiments, the method may include determining whether the replica feedback control loop is stable over a wide range of processes, voltages, temperatures, and common mode selector reference voltages, and in response to determining that the replica feedback control loop is not stable over a wide range of processes, voltages, temperatures, or common mode selector reference voltages, modifying the design of the replica feedback control loop to improve stability. Modifying the design may include modifying a structure, an input, or an operating parameter of one or more of the replica of the inverter-based resistive feedback amplifier or the third differential amplifier.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
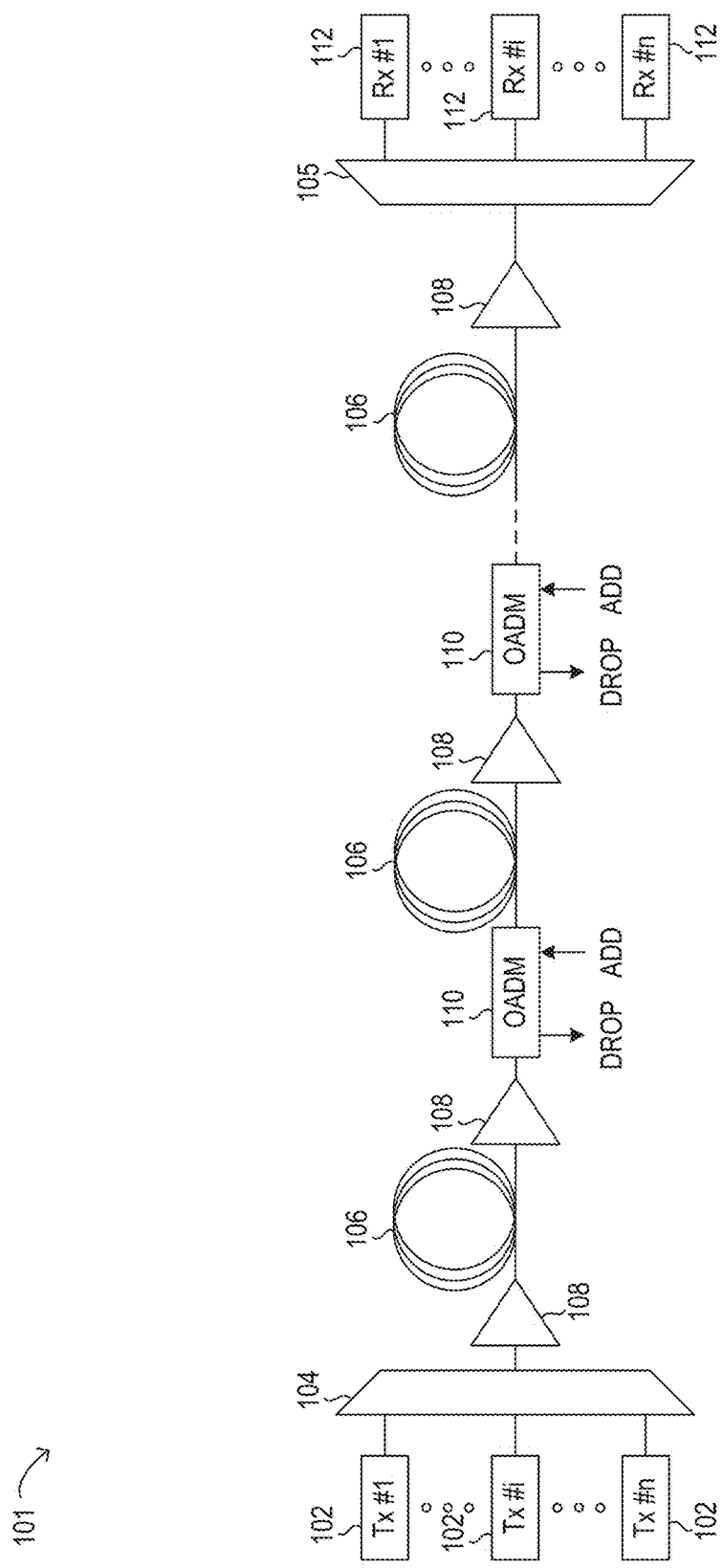
FIG. 1 is a block diagram of selected elements of an embodiment of an optical network, according to at least one embodiment.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

Referring now to the drawings, FIG. 1 illustrates an example embodiment of optical network 101, which may represent an optical communication system. Optical network 101 may include one or more optical fibers 106 to transport one or more optical signals communicated by components of optical network 101. The network elements of optical network 101, coupled together by fibers 106, may comprise one or more transmitters 102, one or more multiplexers (MUX) 104, one or more optical amplifiers 108, one or more optical add/drop multiplexers (OADM) 110, one or more demultiplexers (DEMUX) 105, and one or more receivers 112.

Optical network 101 may comprise a point-to-point optical network with terminal nodes, a ring optical network, a mesh optical network, or any other suitable optical network or combination of optical networks. Optical network 101 may be used in a short-haul metropolitan network, a long-haul inter-city network, or any other suitable network or combination of networks. The capacity of optical network 101 may include, for example, 100 Gbit/s, 400 Gbit/s, or 1 Tbit/s. Optical fibers 106 comprise thin strands of glass capable of communicating the signals over long distances with very low loss. Optical fibers 106 may comprise a suitable type of fiber selected from a variety of different fibers for optical transmission. Optical fibers 106 may include any suitable type of fiber, such as a Single-Mode Fiber (SMF), Enhanced Large Effective Area Fiber (E-LEAF), or TrueWave® Reduced Slope (TW-RS) fiber.

Optical network 101 may include devices to transmit optical signals over optical fibers 106. Information may be transmitted and received through optical network 101 by modulation of one or more wavelengths of light to encode the information on the wavelength. In optical networking, a wavelength of light may also be referred to as a channel that is included in an optical signal (also referred to herein as a "wavelength channel"). Each channel may carry a certain amount of information through optical network 101.

To increase the information capacity and transport capabilities of optical network 101, multiple signals transmitted at multiple channels may be combined into a single wideband optical signal. The process of communicating information at multiple channels is referred to in optics as wavelength division multiplexing (WDM). Coarse wavelength division multiplexing (CWDM) refers to the multiplexing of wavelengths that are widely spaced having low number of channels, usually greater than 20 nm and less than sixteen wavelengths, and dense wavelength division multiplexing (DWDM) refers to the multiplexing of wavelengths that are closely spaced having large number of channels, usually less than 0.8 nm spacing and greater than forty wavelengths, into a fiber. WDM or other multi-wavelength multiplexing transmission techniques are employed in optical networks to increase the aggregate bandwidth per optical fiber. Without WDM, the bandwidth in optical networks may be limited to the bit-rate of solely one wavelength. With more bandwidth, optical networks are capable of transmitting greater amounts of information. Optical network 101 may transmit disparate channels using WDM or some other suitable multi-channel multiplexing technique, and to amplify the multi-channel signal.

Optical network 101 may include one or more optical transmitters (Tx) 102 to transmit optical signals through optical network 101 in specific wavelengths or channels. Transmitters 102 may comprise a system, apparatus or device to convert an electrical signal into an optical signal and transmit the optical signal. For example, transmitters 102 may each comprise a laser and a modulator to receive electrical signals and modulate the information included in the electrical signals onto a beam of light produced by the laser at a particular wavelength, and transmit the beam for carrying the signal throughout optical network 101.

Multiplexer 104 may be coupled to transmitters 102 and may be a system, apparatus or device to combine the signals transmitted by transmitters 102, e.g., at respective individual wavelengths, into a WDM signal.

Optical amplifiers 108 may amplify the multi-channeled signals within optical network 101. Optical amplifiers 108 may be positioned before or after certain lengths of fiber 106. Optical amplifiers 108 may comprise a system, apparatus, or device to amplify optical signals. For example, optical amplifiers 108 may comprise an optical repeater that amplifies the optical signal. This amplification may be performed with opto-electrical or electro-optical conversion.

In some embodiments, optical amplifiers 108 may comprise an optical fiber doped with a rare-earth element to form a doped fiber amplification element. When a signal passes through the fiber, external energy may be applied in the form of an optical pump to excite the atoms of the doped portion of the optical fiber, which increases the intensity of the optical signal. As an example, optical amplifiers 108 may comprise an erbium-doped fiber amplifier (EDFA).

OADMs 110 may be coupled to optical network 101 via fibers 106. OADMs 110 comprise an add/drop module, which may include a system, apparatus or device to add and drop optical signals (for example at individual wavelengths) from fibers 106. After passing through an OADM 110, an optical signal may travel along fibers 106 directly to a destination, or the signal may be passed through one or more additional OADMs 110 and optical amplifiers 108 before reaching a destination.

In certain embodiments of optical network 101, OADM 110 may represent a reconfigurable OADM (ROADM) that is capable of adding or dropping individual or multiple wavelengths of a WDM signal. The individual or multiple wavelengths may be added or dropped in the optical domain, for example, using a wavelength selective switch (WSS) (not shown) that may be included in a ROADM.

As shown in FIG. 1, optical network 101 may also include one or more demultiplexers 105 at one or more destinations of network 101. Demultiplexer 105 may comprise a system apparatus or device that acts as a demultiplexer by splitting a single composite WDM signal into individual channels at respective wavelengths. For example, optical network 101 may transmit and carry a forty (40) channel DWDM signal. Demultiplexer 105 may divide the single, forty channel DWDM signal into forty separate signals according to the forty different channels.

In FIG. 1, optical network 101 may also include receivers 112 coupled to demultiplexer 105. Each receiver 112 may receive optical signals transmitted at a particular wavelength or channel, and may process the optical signals to obtain (e.g., demodulate) the information (i.e., data) included in the optical signals. Accordingly, network 101 may include at least one receiver 112 for every channel of the network.

Optical networks, such as optical network 101 in FIG. 1, may employ modulation techniques to convey information in the optical signals over the optical fibers. Such modulation schemes may include phase-shift keying (PSK), frequency-shift keying (FSK), amplitude-shift keying (ASK), pulse-amplitude modulation (PAM), and quadrature amplitude modulation (QAM), among other examples of modulation techniques. In PSK, the information carried by the optical signal may be conveyed by modulating the phase of a reference signal, also known as a carrier wave, or simply, a carrier. The information may be conveyed by modulating the phase of the signal itself using two-level or binary phase-shift keying (BPSK), four-level or quadrature phase-shift keying (QPSK), multi-level phase-shift keying (M-PSK) and differential phase-shift keying (DPSK). In QAM, the information carried by the optical signal may be conveyed by modulating both the amplitude and phase of the carrier wave. PSK may be considered a subset of QAM, wherein the amplitude of the carrier waves is maintained as a constant.

Additionally, polarization division multiplexing (PDM) technology may provide achievement of a greater bit rate for information transmission. PDM transmission comprises independently modulating information onto different polarization components of an optical signal associated with a channel. In this manner, each polarization component may carry a separate signal simultaneously with other polarization components, thereby enabling the bit rate to be increased according to the number of individual polarization components. The polarization of an optical signal may refer to the direction of the oscillations of the optical signal. The term "polarization" may generally refer to the path traced out by the tip of the electric field vector at a point in space, which is perpendicular to the propagation direction of the optical signal.

In an optical network, such as optical network 101 in FIG. 1, it is typical to refer to a management plane, a control plane, and a transport plane (sometimes called the physical layer). A central management host (not shown) may reside in the management plane and may configure and supervise the components of the control plane. The management plane includes ultimate control over all transport plane and control plane entities (e.g., network elements). As an example, the management plane may include a central processing center (e.g., the central management host), including one or more processing resources, data storage components, etc. The management plane may be in electrical communication with the elements of the control plane and may also be in electrical communication with one or more network elements of the transport plane. The management plane may perform management functions for an overall system and provide coordination between network elements, the control plane, and the transport plane. As examples, the management plane may include an element management system (EMS) which handles one or more network elements from the perspective of the elements, a network management system (NMS) which handles many devices from the perspective of the network, and an operational support system (OSS) which handles network-wide operations.

Modifications, additions or omissions may be made to optical network 101 without departing from the scope of the disclosure. For example, optical network 101 may include more or fewer elements than those depicted in FIG. 1. Also, as mentioned above, although depicted as a point-to-point network, optical network 101 may comprise any suitable network topology for transmitting optical signals such as a ring, a mesh, and a hierarchical network topology.

As discussed above, the amount of information that may be transmitted over an optical network may vary with the number of optical channels coded with information and multiplexed into one signal. Accordingly, an optical fiber employing a WDM signal may carry more information than an optical fiber that carries information over a single channel. Besides the number of channels and number of polarization components carried, another factor that affects how much information may be transmitted over an optical network is the bit rate of transmission. The higher the bit rate, the greater the transmitted information capacity. Achieving higher bit rates may be limited by the availability of wide bandwidth electrical driver technology, digital signal processor technology and increases in the required OSNR for transmission over optical network 101.

As previously noted, a high-speed optical receiver (such as one of the receivers 112 illustrated in FIG. 1) might include a photo detector (e.g., a photodiode, phototransistor, or another suitable device) that senses the incoming analog optical power (which may be encoded, e.g., as binary or multi-level PAM signals) and converts it into electrical current. Due to the nature of photodiode technology, the converted electrical signal includes both an AC component (which, in the examples described herein, may be referred to as $I_{pd}$) and a DC component (which may be referred to as $I_{pdc}$). In some cases, the amplitude of the AC component may be relatively small (e.g., often around the 100 µA range, even when the data rate is in the range of tens of gigabits per second). The photodiode may be a single-ended device. In some optical networks, in order to convert such a small current into a large voltage (e.g., one that maybe sampled as valid binary or multi-level PAM signals), the front end system of the optical receivers may include a circuit commonly referred to as a transimpedance amplifier (TIA). A transimpedance amplifier may, in various embodiments, be used to amplify the small current into a signal with a large voltage swing, and to provide at least some amount of noise margin (e.g., for noise that may be inherent in the device and/or power supply noise). One such optical receiver front end system is illustrated in FIG. 2.

Figure 2:
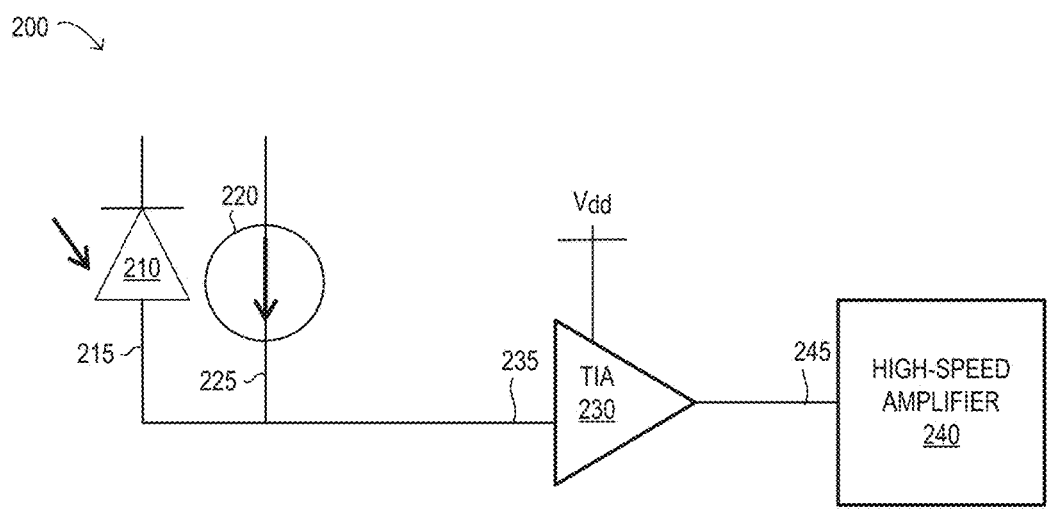
FIG. 2 is a block diagram of selected elements of front end system for an optical receiver that includes a transimpedance amplifier, according to at least one embodiment.

FIG. 2 is a block diagram of selected elements of front end system 200 for an optical receiver, according to at least some embodiments. In this example embodiment, an optical signal is sensed by the photo detector (e.g., photodiode 210), and the photo detector is biased so that it produces a low-level current signal. More specifically, photodiode 210 produces a current having an AC portion (shown as $I_{pd}$ 215) and a DC portion (illustrated in FIG. 2 as $I_{pdc}$ 225 from DC current source 220). In this example, optical receiver front end system 200 includes a transimpedance amplifier (TIA 230), which is a single-ended amplifier (e.g., an operational amplifier) that measures the low-level current signal generated by the photo detector (shown as TIA input 235) and converts it to a voltage. The output of TIA 230 (shown as 245) is then input to a high-speed amplifier (shown as 240), which amplifies this input signal so that it may be sampled.

Using a conventional optical receiver front end system such as that illustrated in FIG. 2 (e.g., one that includes one single-ended TIA), the system may not be able to reject 100% of the power supply noise (e.g., $V_{dd}$ noise). Such power supply noise may affect the common mode inputs to the high-speed amplifier (due to degradation of the input signals) and/or the sensitivity of the system to photodiode inputs. This may be especially true for communications networks that operate at very high speeds and that have very small input signals (e.g., small optical input currents). In at least some embodiments, the optical receiver front end systems described herein may provide better results then the front end system illustrated in FIG. 2 for these types of communications networks.

In various embodiments, the optical receivers described herein may control the output voltage level of a transimpedance amplifier (Vo) and may generate another signal (Vo1) that has substantially the same DC value as Vo and that synchronously tracks the noise from the power supply ($V_{dd}$). These two voltage sources may then be used as inputs to a high-speed differential amplifier in the main signal path. As noted above, the common mode of the input of a differential amplifier may be an important consideration in high performance receiver designs.

In at least some embodiments, an optical receiver that addresses the small amplitude and noise problem described above may include a receiver front end system comprising a main TIA (and an associated main feedback control loop) and a replica TIA (and an associated replica feedback control loop). An example embodiment of such a system is illustrated as optical receiver front end system 300 in FIG. 3. In this example, the main feedback control loop 340 (which is outlined by dotted lines in FIG. 3) includes the main TIA (referred to herein as ITIA 312, which is inverted with a feedback resistor $R_{fb}$ 310), a main filter and amplifier block ($A_{mamp}$ 314), an offset/common mode feedback control amplifier ($A_{osamp}$ 316), and an NMOS transistor M0 (308).

The replica feedback control loop 350 (which is outlined by dashed lines in FIG. 3) includes a replica TIA (referred to herein as RITIA 362, which is inverted with a feedback resistor $R_{rfb}$ 360), a replica common mode feedback control amplifier ($A_{ramp}$ 366), and an NMOS transistor M1 (358). The outputs of main filter and amplifier block ($A_{mamp}$ 314) may serve as inputs to a sampler 318. Sampler 318 may, for example, sample these inputs as valid binary or multi-level PAM signals, and may generate output data representing information that was encoded in the optical signal sensed by photo detector 302. This output data is illustrated in FIG. 3 as DATAO/DATAOX.

Note that, in some embodiments, one or more of the components of the replica feedback control loop 350 may be similar to (or even exact replicas of) the corresponding components in the main control loop 340. For example, $A_{ramp}$ 366 may be similar to feedback $A_{osamp}$ 316, and RITIA 362 may be similar to ITIA 312. However, the main control loop 340 may also include a main filter and amplifier block ($A_{mamp}$ 314), which may provide additional gain. By contrast, $A_{ramp}$ 366 in replica control loop 350 may, on its own, provide a reasonable gain for the low-frequency DC voltage feedback control provided by replica control loop 350. In other words, unlike for $A_{mamp}$ 314 (which is on the main high-speed communication path), the design constraints on the feedback control amplifiers $A_{osamp}$ 316 and $A_{ramp}$ 366 (which attempt to extract the DC levels of the TIA outputs) may be relatively relaxed. In at least some embodiments, the TIA components illustrated in FIG. 3 (e.g., ITIA 312 and/or RITIA 362) may be implemented using an operation amplifier that operates in the linear gain region (e.g., as a single-ended linear amplifier).

Figure 3:
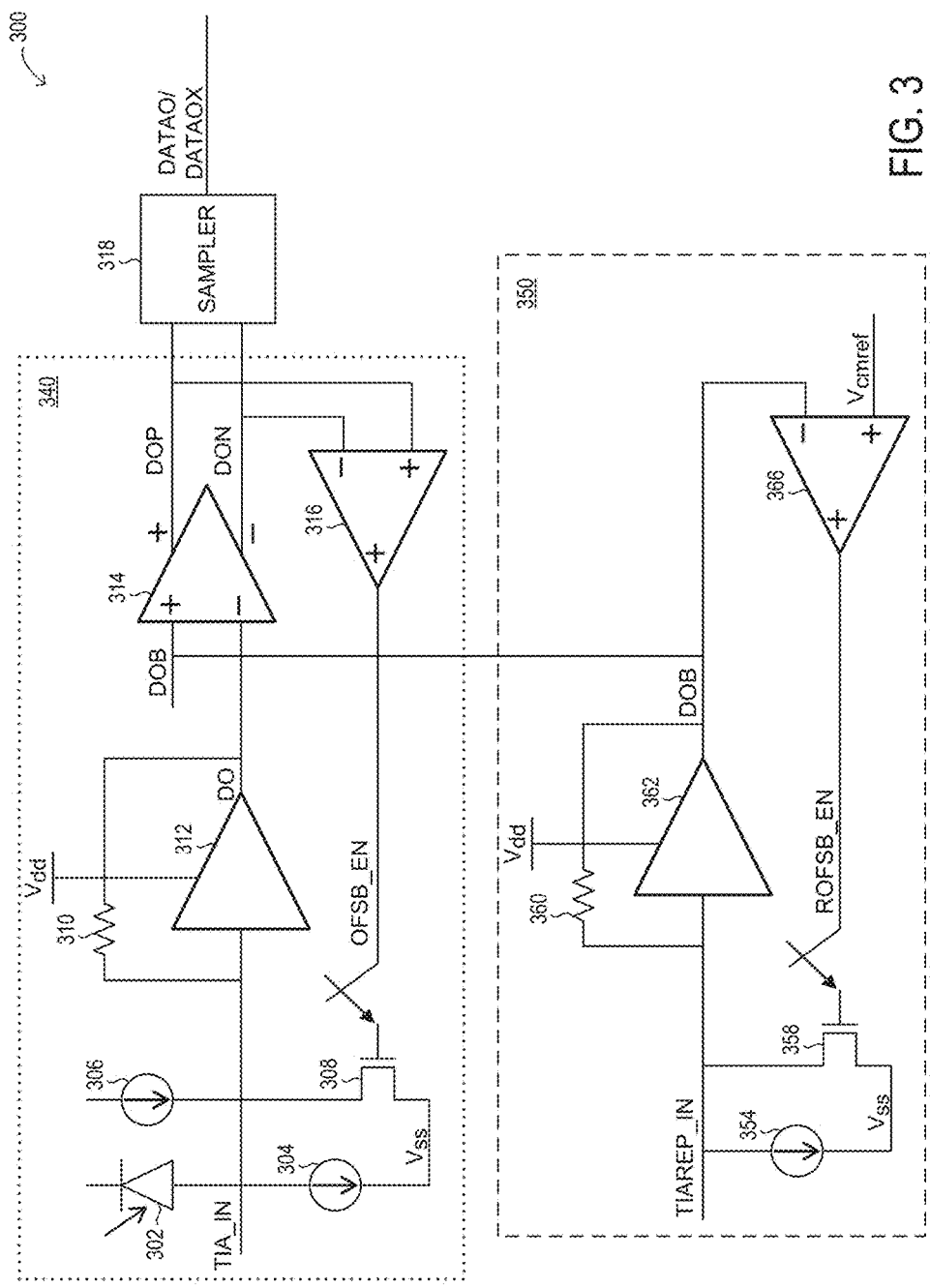
FIG. 3 is a block diagram of selected elements of an optical receiver that includes multiple transimpedance amplifiers and a replica feedback control loop, according to at least one embodiment.

As illustrated in FIG. 3, unlike with the optical receiver front end system illustrated in FIG. 2, the optical receiver front end system illustrated in FIG. 3 may produce an additional input to a high-speed differential amplifier on the main communication path (one that is an output from the replica feedback control loop). As described in more detail herein, the optical receiver front end system illustrated in FIG. 3 may provide substantially the same noise to the two inputs into the main amplifier ($A_{mamp}$ 314). More specifically, optical receiver front end system 300 may provide two noise sources having substantially the same DC level to the inputs of the main differential amplifier circuit, making the effect of the noise very small. For example, when the same noise is applied to both of the inputs of the differential amplifier, they will generate substantially the same effect at the outputs (i.e., they rise or fall together). In other words, because the differential amplifier amplifies the difference between two input voltages while suppressing any voltage common to the two inputs (the common mode), the power supply noise may be rejected (filtered out) and the signal of interest (the portion of the input voltage that represents the optical signal sensed by the photodiode) may be amplified.

In the example optical receiver front end system 300 illustrated in FIG. 3, the circuits ITIA 312 and RITIA 362 are CMOS inverters that are biased through resistors $R_{fb}$ 310 and $R_{rfb}$ 360, respectively, and that operate as linear feedback amplifiers (e.g., the PMOS and NMOS transistors of these inverters both operate in the saturation region). The main amplifier $A_{mamp}$ 314 is a differential high-gain, high-speed filter/amplifier (which may be a multi-stage amplifier) whose output common mode may be controlled by an internal circuit (e.g., by a bias current). For example, the output common mode may be controlled using a source coupled NMOS pair with serial inductor and resistor loading, in some embodiments.

In the example system illustrated in FIG. 3, the inputs to $A_{mamp}$ 314 are from the output of ITIA 312 (shown as DO), and the output of RITIA 362 (shown as DOB). As noted above, in at least some embodiments, $A_{osamp}$ 316 and $A_{ramp}$ 366 may be differential-input, single-ended output, low-frequency, high-gain linear amplifiers. In this example, both of the NMOS transistors M0 308 and M1 358 may be operating in the saturation region as transconductance amplifiers that convert voltage to current (e.g., as switch current sources). To define the common mode of the high-speed amplifier $A_{mamp}$ 314, a suitable control voltage $V_{cmref}$ may be chosen such that amplifier $A_{mamp}$ 314 operates in the linear gain region. In at least some embodiments, including that illustrated in FIG. 3, the optical receiver front end system may include the two control loops (340 and 350) described herein.

Replica feedback control loop 350 serves as the feedback control loop for the replica TIA, RITIA 362. As noted above, in some embodiments, RITIA 362 may be implemented as a CMOS inverter that is biased through a resistor $R_{fb}$ 310 and that operates in the linear gain region. However, the operating region of RITIA 362 may be limited (e.g., it may be limited to about $V_{dd}/2$) and the output of RITIA 362 may vary widely dependent on the process in which it is implemented or on the voltage and/or temperatures at which it operates (i.e., the output may be dependent on specific PVT values). In at least some embodiments, RITIA 362 may not be able to directly drive the high-speed differential amplifier $A_{mamp}$ 314, as this amplifier may be designed to operate with an input common mode level that is substantially different from $V_{dd}/2$ and that has a small range of variation. For example, a particular NMOS source coupled pair might require an input common mode of about 0.65 $V_{dd}$, in some embodiments. To ensure a proper input common mode for high-speed amplifier $A_{mamp}$ 314, the replica TIA feedback control loop may force the voltage at output node DOB ($V_{dob}$) to the value of the reference/control voltage $V_{cmref}$, which represents the desired common mode voltage. Note that this reference voltage $V_{cmref}$ may be easily controlled (e.g., using a fixed or dynamically configurable value), since it is a DC value. Once the value of $V_{dob}$ matches that of $V_{cmref}$, $V_{dob}$ may become the reference for main path feedback control loop 340. At that point $V_{dob}$ may be used to force the output signal DO in the main communication path to have substantially the same DC value as that of DOB.

In at least some embodiments, both ITIA 312 and RITIA 362 may operate at a data rate in the tens of gigabits per second. In some embodiments, feedback control amplifier $A_{ramp}$ 366 may be a relatively low-frequency, high-gain amplifier. In one example, feedback control amplifier $A_{ramp}$ 366 may achieve gains greater than 40 db or even 50 db, in some embodiments. Similarly, feedback control amplifier $A_{osamp}$ 316 (another relatively low-frequency amplifier) may achieve gains greater than 20 db, in some embodiments. In at least some embodiments, current DAC, $I_{rdac}$ 354 (in replica control loop 350) may provide a default coarse current (e.g., a current of several hundred microamps) to the input of RITIA 362 (shown as TIAREP_IN). Similarly, current DAC $I_{mdac}$ (in main control loop 340), may provide a default coarse current to the input of ITIA 312 (as TIA The characteristics of the optical receiver front end systems described herein (e.g., the relationship between the DC gain and the amplifier input error) may be illustrated by way of the following example. If the voltage gain of feedforward amplifier $A_{mamp}$ 314=$A_1$, and the voltage feedback path that includes amplifier $A_{osamp}$ 316, switch current source M0 308 and the voltage gain of main TIA amplifier circuit (which includes ITIA 312 and $R_{fb}$ 310) is $A_{fb}$, then the input voltage DC error $V_{err}=V_{dob}-V_{do}=1/(A_1*A_{fb})$. As illustrated in this example, when the gains of the amplifiers are increased, the error is reduced.

Note that, in some embodiments, the optical receiver front end systems described herein (such as optical receiver front end system 300) may (dependent on the specific circuit designs and the underlying technologies in which they are built) operate at speeds up to the 10 s of gigabits per second. In other embodiments, they may operate at data rates in the terabit range (e.g., up to 1 terabit/s or higher). In other words, architecturally, these optical receiver front end systems may be able to support extremely high-speed communications.

Initially, in the example optical receiver front end system illustrated in FIG. 3, the replica TIA (shown as RITIA 362, which may be similar to, or a copy of, the main TIA, ITIA 312), together with a low-frequency high-gain amplifier (such as $A_{ramp}$ 366), and an NMOS transistor (such as M1 358) may form a low-frequency replica feedback control loop (such as control loop 350). The output node of this replica feedback control (such as DOB in FIG. 3) may follow the input node $V_{cmref}$, such that $V_{dob}=V_{cmref}$ after the replica control loop is activated (e.g., after signal ROFS-B_EN is enabled) and once the replica feedback control loop has settled.

Figure 4:
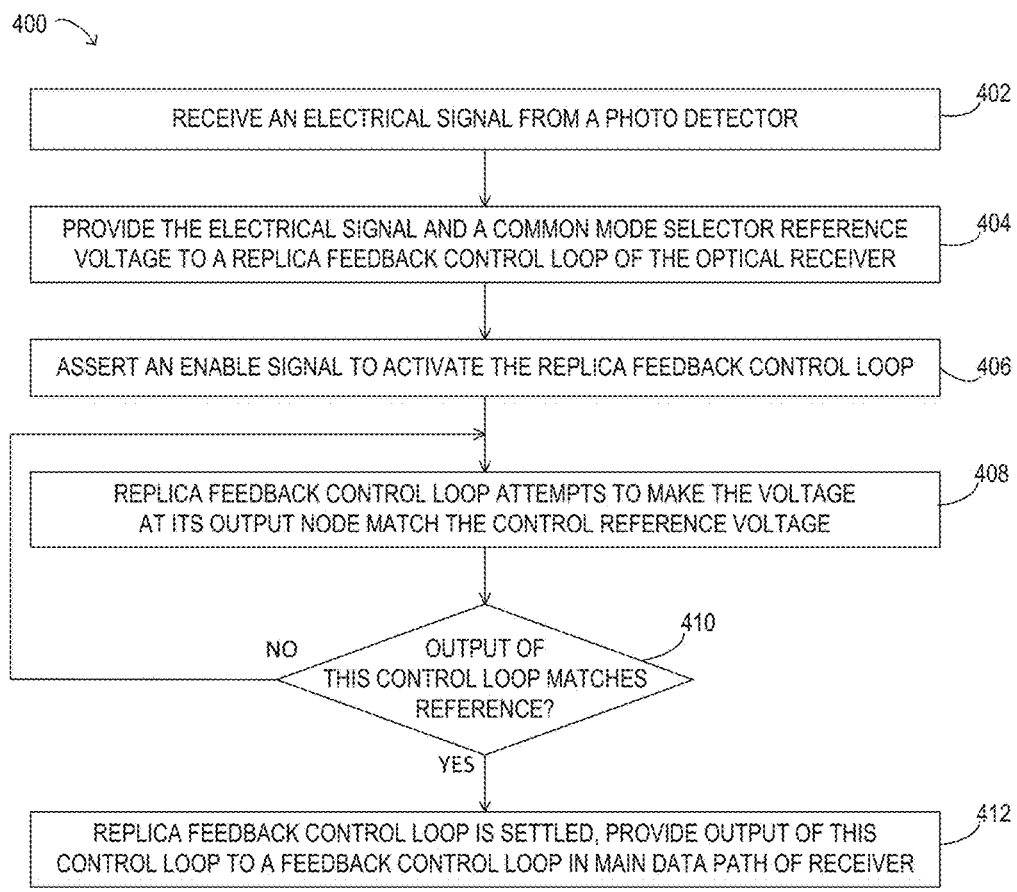
FIG. 4 is a flow diagram illustrating selected elements of a method of operation 400 of a replica feedback control loop in an optical receiver, according to at least one embodiment.

FIG. 4 is a flow diagram illustrating selected elements of a method of operation 400 of the replica feedback control loop of an optical receiver, according to at least some embodiments. As illustrated at step 402, in this example, the method may include receiving an electrical signal from a photo detector. The method may also include, at step 404, providing the electrical signal and a common mode selector reference voltage to a replica feedback control loop of the optical receiver, and at step 406, asserting an enable signal in order to activate the replica feedback control loop.

Once the replica feedback control look has been enabled, the method may include, at step 408, the replica feedback control loop attempting to make the voltage at the output node of the replica TIA match the reference voltage. The replica feedback control loop may, during operation, continue to attempt to make this output voltage match the reference voltage. This is illustrated in FIG. 4 by the path from the negative exit of decision block 410 to step 408. Once the output of this control loop matches the reference voltage (shown as the positive exit of decision block 410), the replica feedback control loop is settled, and the method may include, at step 412, providing the output of this control loop to a feedback control loop in the main data path of receiver.

In reference to the example optical receiver front end system illustrated in FIG. 3, once the output of the replica feedback control loop (DOB) is settled (e.g., once the output of the replica TIA value matches, within an acceptable error, the reference voltage), the second (main) feedback control loop may be activated (e.g., by asserting the signal OFS-B_EN). This main feedback control loop (which may operate at low frequency) may include a main TIA (such as ITIA 312 in FIG. 3), a high-speed differential amplifier in the main data path (such as $A_{mamp}$ 314 in FIG. 3), a low-frequency high-gain amplifier (such as $A_{osamp}$ 316 in FIG. 3), and an NMOS transistor (such as MO 308).

Figure 5:
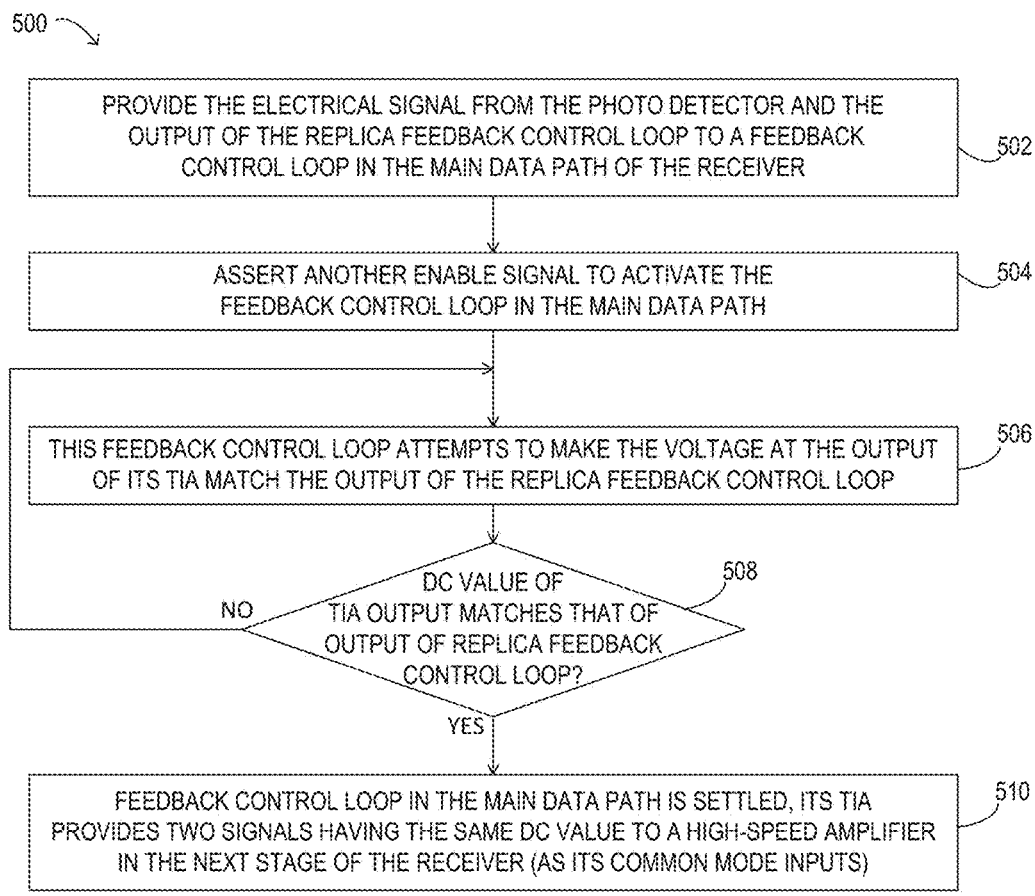
FIG. 5 is a flow diagram illustrating selected elements of a method of operation 500 of a main feedback control loop in an optical receiver, according to at least one embodiment.

FIG. 5 is a flow diagram illustrating selected elements of a method of operation 500 of the main feedback control loop of an optical receiver, according to at least some embodiments. As illustrated at step 502, in this example, the method may include providing the electrical signal from the photo detector and the output of the replica feedback control loop to a feedback control loop in the main data path of the receiver. The method may also include, at step 504, asserting an enable signal to activate the feedback control loop in the main data path (e.g., a different enable signal than that used to activate the replica feedback control loop). During operation, the method may include, at step 506, this main feedback control loop attempting to make the voltage at the output of the TIA in the main feedback control loop match the output of the replica TIA in the replica feedback control loop.

As illustrated by the path from the negative exit of decision block 508 to step 506, the main feedback control loop may continue operating to attempt to make the DC value of the output of the TIA in the main feedback control loop match the output of the replica TIA in the replica feedback control loop. Once the DC value of the TIA output in the main feedback control loop matches that of the output of the replica TIA in the replica feedback control loop (shown as the positive exit from decision block 508), the feedback control loop in the main data path may be considered settled. At this point, in step 510, the two TIAs may provide respective signals having substantially the same DC value to a next stage of the receiver. For example, the method may include providing these two signals to a high-speed amplifier of the receiver as common mode inputs.

Note that, in at least some embodiments, the overall loop gain at DC (for the main feedback control loop) may be large enough so that the output of ITIA 312 (DO) follows that of RITIA 362 (DOB), while at substantially the same time it cancels out the DC offset of main amplifier $A_{mamp}$ 314. Note also that, as illustrated in the examples herein, the replica TIA output may have two paths: one to the low-frequency amplifier $A_{ramp}$ 366 (which has large input impedance), and the other to the high-speed amplifier $A_{mamp}$ 314 (which has very low impedance). In at least some embodiments, when noise from the power supply passes through the TIAs (e.g., ITIA 312 and RITIA 362) to their outputs (e.g., to DO and DOB, respectively), substantially the same noise source may be created at both inputs of the high-speed differential amplifier $A_{mamp}$ 314. Thus, the noise may not distort the output of $A_{mamp}$ 314.

Figure 6:
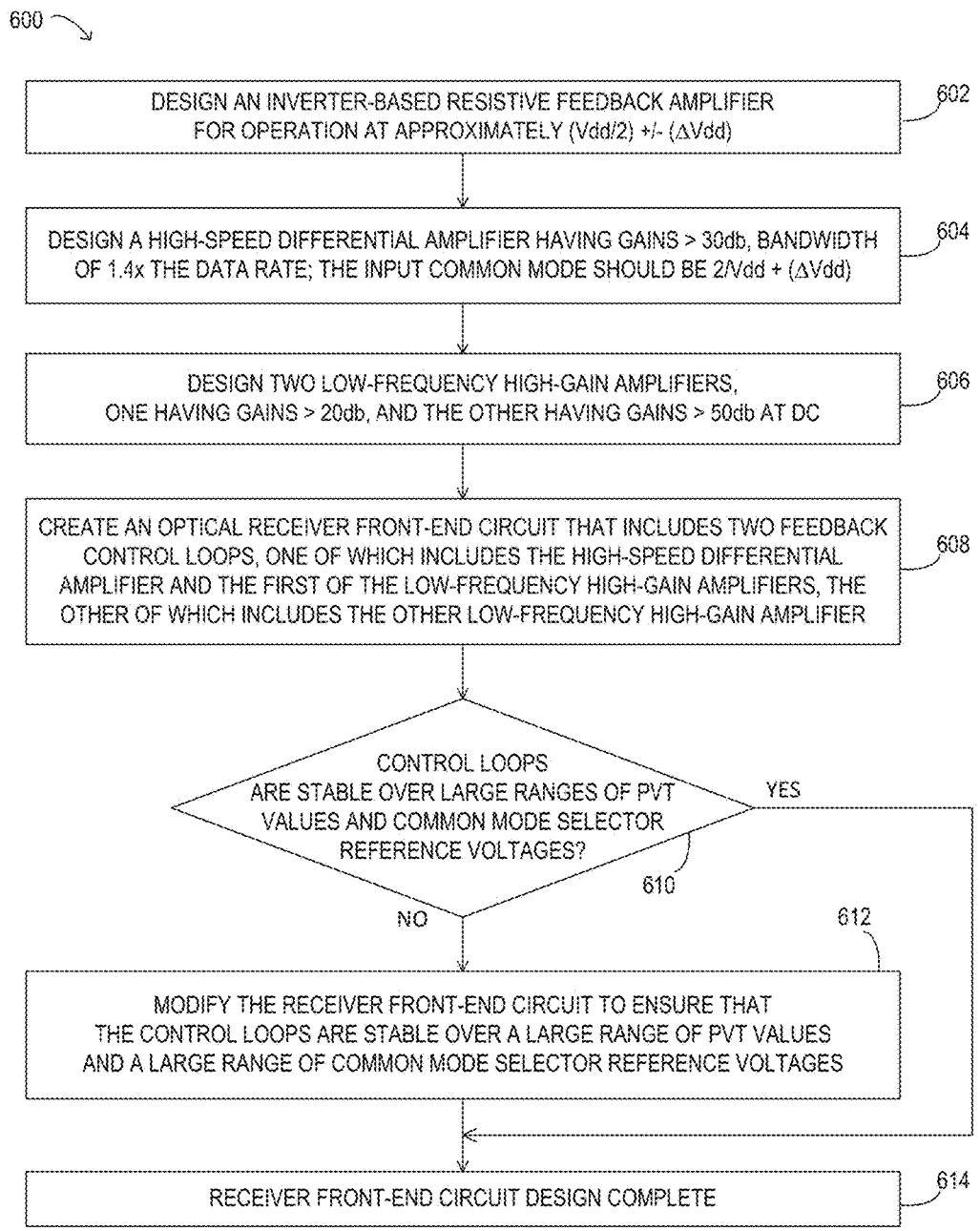
FIG. 6 is a flow diagram illustrating selected elements of one embodiment of a method 600 for designing an optical receiver front end system, as described herein.

FIG. 6 is a flow diagram illustrating selected elements of one embodiment of a method 600 for designing an optical receiver front end system, as described herein. As illustrated at step 602, in this example, the method may include designing an inverter-based resistive feedback amplifier (e.g., a TIA) for operation at approximately $(V_{dd}/2)+/-(\Delta V_{dd})$. For example, in one embodiment, this amplifier may be designed to operate at approximately $V_{dd}/2+/-200$ mV, at the desired data rate. The method may also include, at step 604, designing a high speed differential amplifier having gains >30 db and bandwidth of 1.4× the data rate. In at least some embodiments, the input common mode may be $2/V_{dd}+(\Delta V_{dd})$. For example, this amplifier (which may be similar to $A_{mamp}$ 314 in FIG. 3) may have a common mode level of 0.65 $V_{dd}$.

As illustrated at step 606, the method may include designing two low-frequency high-gain amplifiers, one that achieves gains greater than 20 db, and the other achieving gains greater than 50 db at DC. These amplifiers may be similar to $A_{osamp}$ 316 and $A_{ramp}$ 366, respectively). The method may also include, at step 608, creating an optical receiver front-end circuit that includes two feedback control loops, one of which includes the TIA, the high-speed differential amplifier, and the first of the low-frequency high-gain amplifiers, and the other of which includes a replica of the TIA and the other low-frequency high-gain amplifier, such as those described herein.

If the control loops are not stable over large ranges of PVT values and/or common mode selector reference voltages (e.g., values of $V_{cmref}$), the method may include modifying the receiver front-end circuit to ensure that the control loops are stable over a large range of PVT values and a large range of common mode selector reference voltages. For example, the method may include modifying the structure, one of the inputs, and/or an operating parameter of one or more components of one of the control loops (e.g., one of the amplifiers, resistors, or transistors included in the control loop) to increase or decrease the gain, to adjust a bias or sensitivity of a component, to change the output of a current source, or to otherwise improve the stability and/or operating range of the receiver front-end circuit. This is illustrated in FIG. 6 by the negative exit from decision block 610 and step 612. If (or once) the control loops are stable over large ranges of PVT values and common mode selector reference voltages (shown as the positive exit from decision block 610), the receiver front-end circuit design may, at step 614, be complete.

Note that, while the example method illustrated in FIG. 6 includes designing the TIAs, the feedback control amplifiers, and the main high-speed differential amplifier of the optical receiver front end systems described herein, in other embodiments, the design of one or more of these amplifiers may be selected from a library, reused from an earlier design, or obtained from third party vendor for inclusion in the optical receiver front end system, rather than being designed specifically for use in the system.

Transient simulation results using 28 nm CMOS technology have shown that the duel feedback loops of the optical receiver front end systems described herein would provide substantially the same DC outputs, which may then serve as the common mode inputs for a high-speed amplifier that follows in the main communication path. More specifically, once both of the control loops 350 and 340 of the example optical receiver front end system 300 illustrated in FIG. 3 have settled, the high-speed amplifier output produces correct waveforms that are analogous and complimentary to each other. Selected results of these simulations are illustrated in FIGS. 7A-7B and 8A-8B.

Figure 7A:
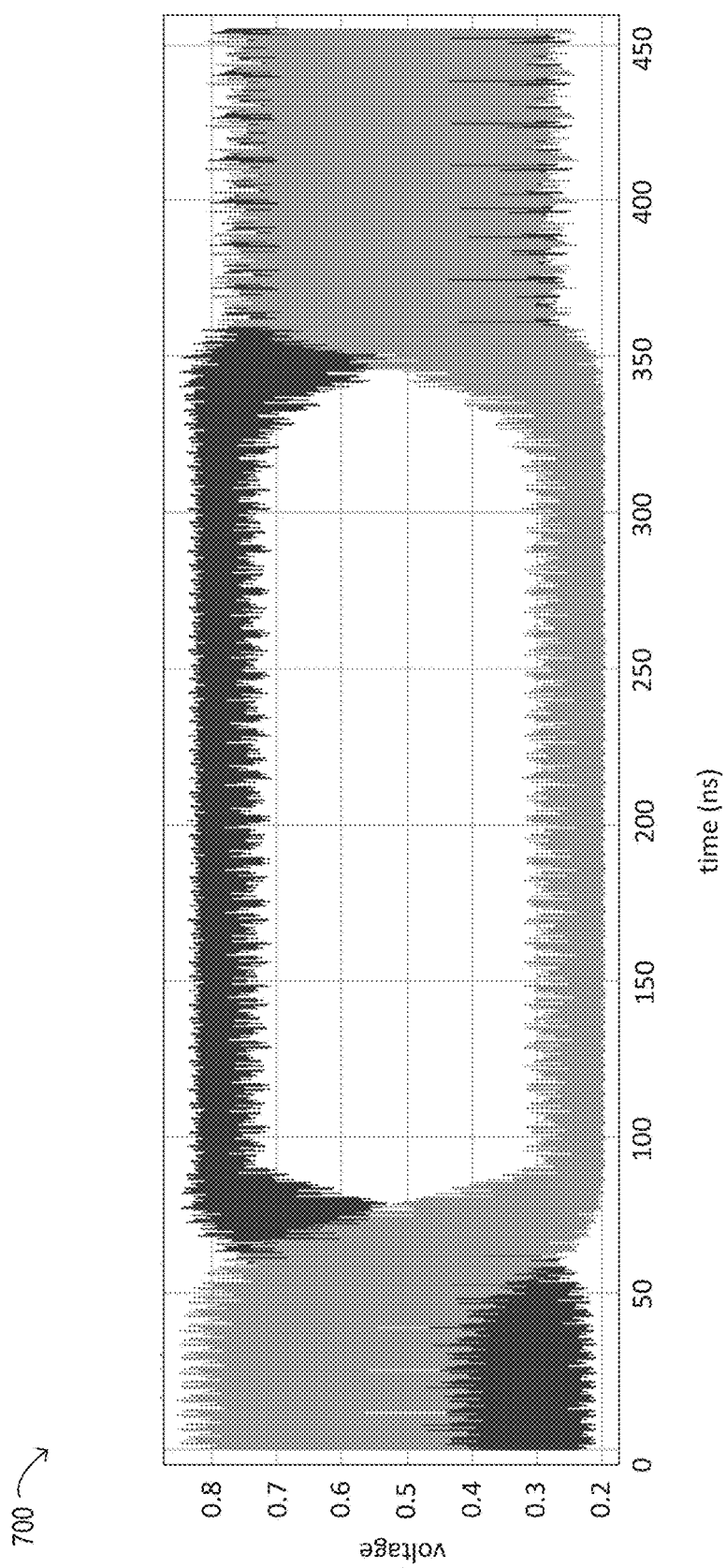
FIGS. 7A-7B and 8A-8B illustrate selected results of simulations of the optical receivers described herein.

More specifically, the waveforms in FIG. 7A illustrate that, initially, the outputs DO and DOB are not settled to the correct common mode. Therefore, the differential outputs DOP and DON (shown in two different shades in FIG. 7A) are initially at different common modes and have different amplitudes. In other words, because the outputs DO and DOB are not symmetric, the signals DOP and DON are distorted.

Figure 7B:
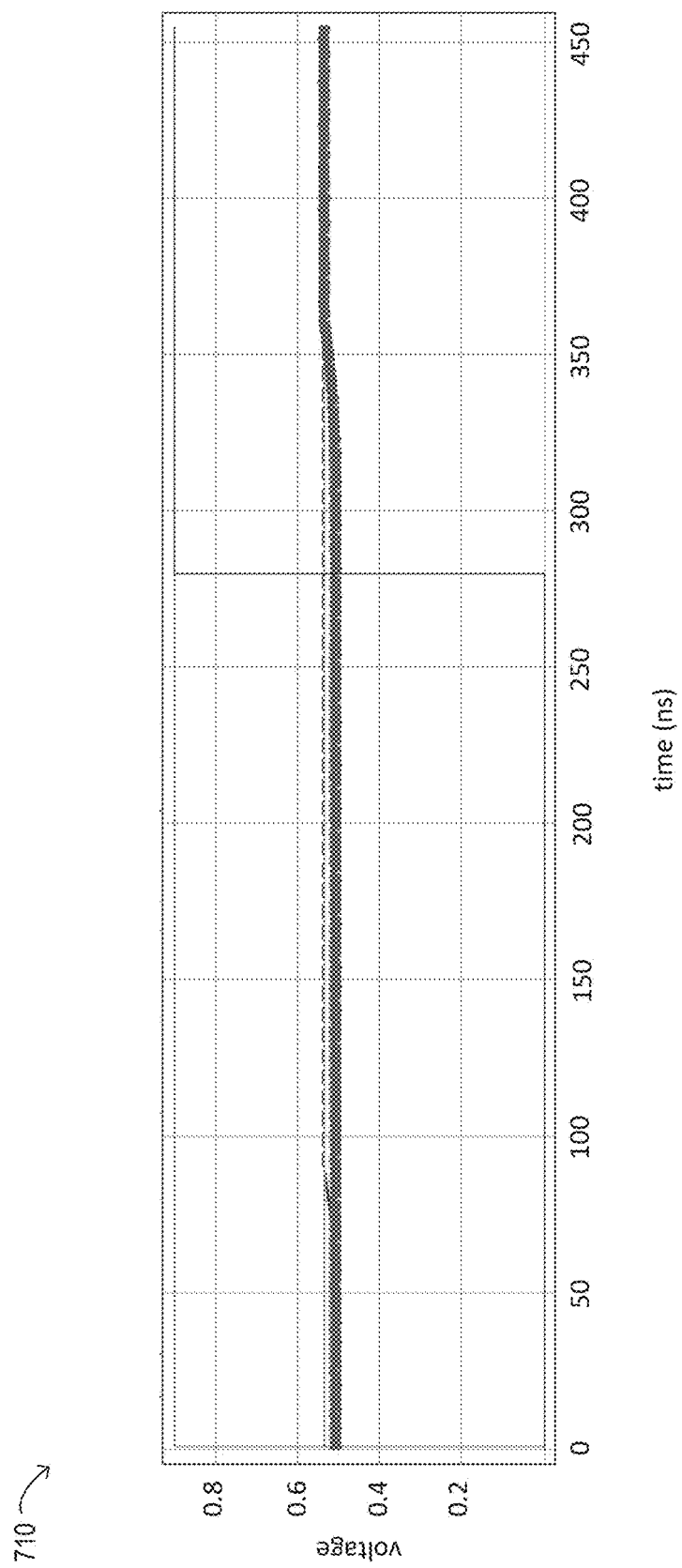

The group of waveforms shown in FIG. 7B illustrate that after signal ROFSB_EN is inserted at time 0 (thus activating the replica feedback control loop 350), and after about 100 nanoseconds, the signal DOB (shown as a dashed line) reaches the value of $V_{cmref}$ (shown as a thin, roughly horizontal line), which is the desired common mode level for amplifier $A_{mamp}$ 314. After DOB is settled (at about 280 nanoseconds), the signal OFSB_EN is asserted (thus activating the main feedback control loop 340). About 80 nanoseconds later, the common mode for node DO (shown as a thick, roughly horizontal line) is settled close to the DOB and/or $V_{cmref}$ values. Shortly after that, the differential output of the high-speed amplifier outputs correct complimentary high-speed analog signals (not shown in FIG. 7B).

Figure 8A:
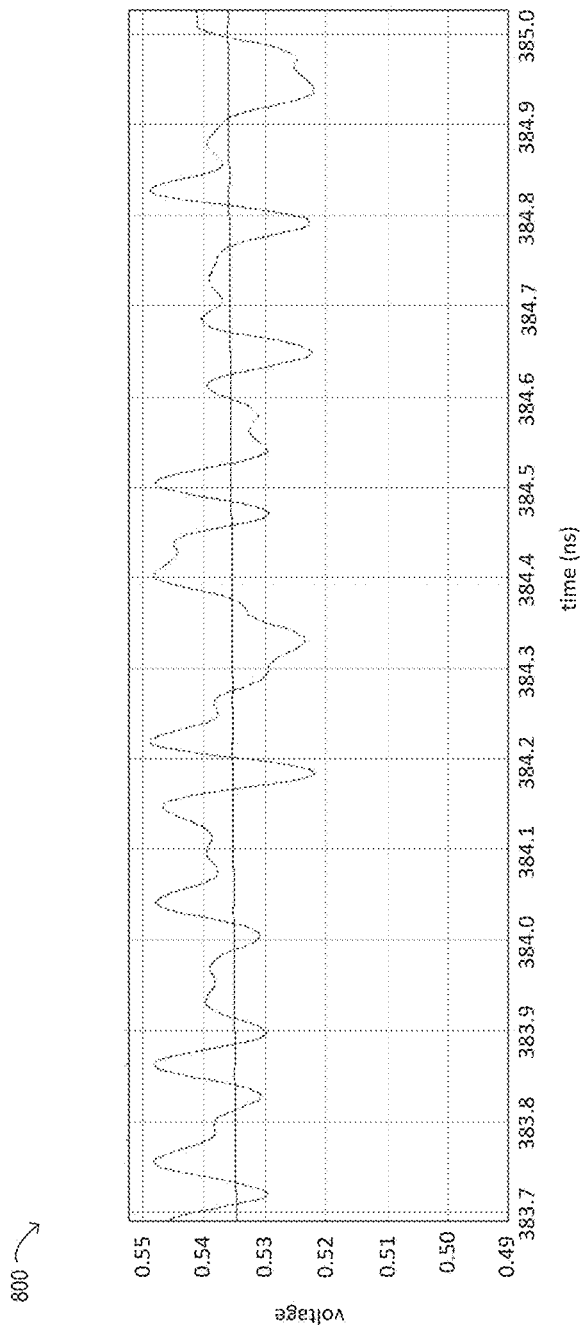
Figure 8B:
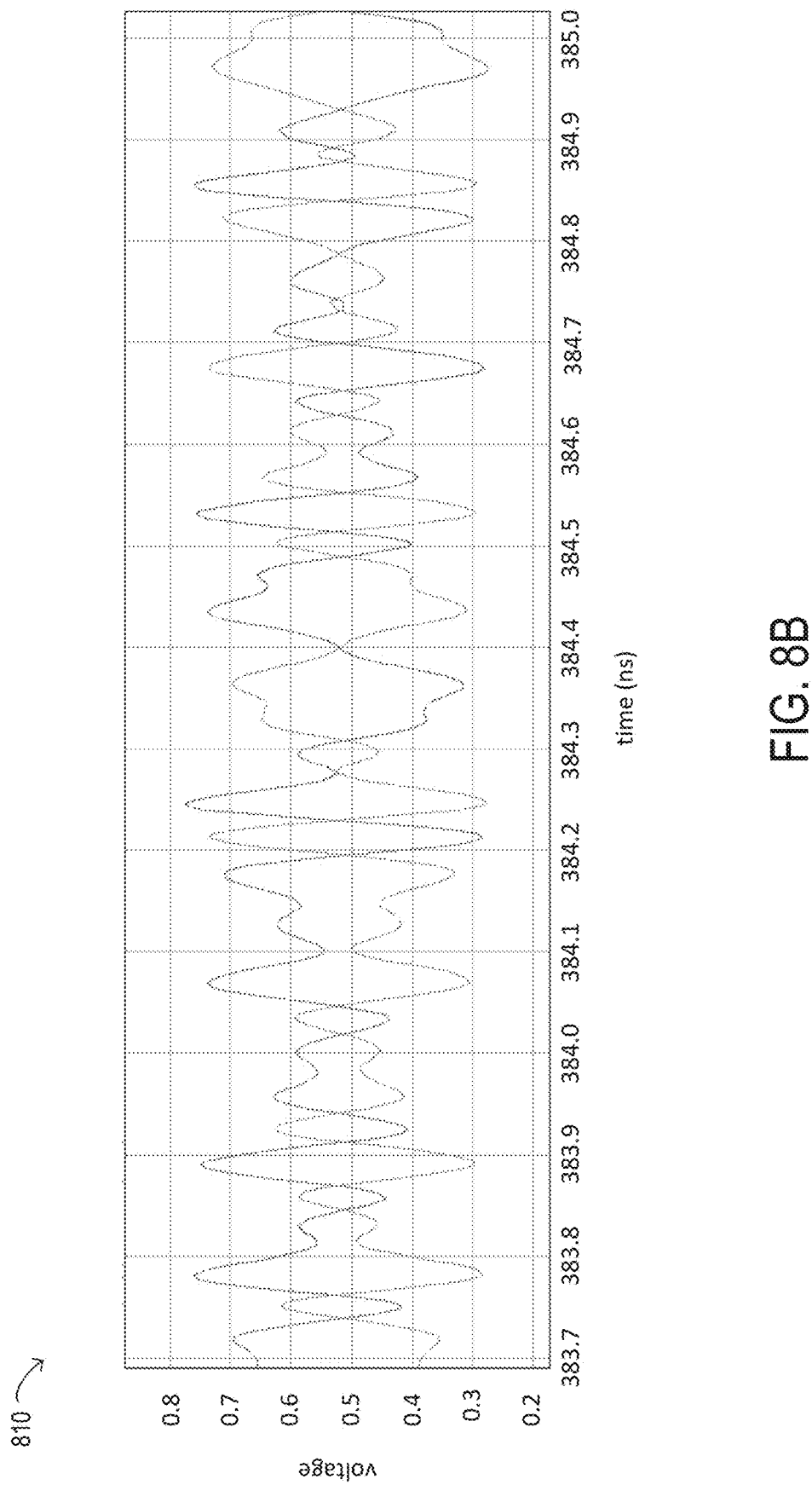

The waveforms shown in FIG. 8A illustrate the values of DO (which represents the output of the main TIA for a given input signal) and DOB (shown as a thin, roughly horizontal line) once both of the control loops have settled (e.g., about 380 nanoseconds after the replica control loop is enabled). As illustrated in this example, these two signals have substantially the same common mode. These signals are the two inputs to the high-speed differential amplifier $A_{mamp}$ 314 in FIG. 3. FIG. 8B illustrates the corresponding waveforms for the differential outputs DOP and DON (i.e., the two outputs of $A_{mamp}$ 314). As illustrated in this example, once both of the control loops have settled, $A_{mamp}$ 314 produces outputs that are symmetric (complementary) around a settled common mode. More specifically, FIG. 8B illustrates that $A_{mamp}$ 314 produces two highly symmetrical high-speed analog waveforms around a common mode level of about 0.53 v. These outputs may be more suitable for sampling (e.g., for detecting the information encoded in the input signal) than the outputs of conventional optical receiver front end systems that do not include a replica TIA and corresponding replica feedback control loop.

In this particular example, the input signal used in the simulation was a pulse-amplitude modulated (PAM) signal with four analog levels. However, the optical receiver front end systems described herein may also be used to improve the performance of an optical receiver when presented with other types of input signals, including more or less complex signals having any number of levels. For example, the optical receiver front end systems described herein may improve the performance of an optical receiver regardless of the type of modulation and/or encoding scheme that was applied to generate the input signal. In some cases, the input signal may be DC balanced, meaning that, when averaged over a period of time, the common mode is approximately flat. In other cases, the input signal may not have a flat common mode. In such cases, the control loops of the optical receiver front end systems described herein may not cause the inputs to the high-speed differential amplifier $A_{mamp}$ 314 to settle down to a fixed common mode value, but may continually adapt those inputs to the common mode of the input signal over time.

In various embodiments, the optimal range of the input common mode of the differential high-speed amplifier ($A_{mamp}$ 314) may be set differently under different PVT conditions. For example, under typical conditions, the common mode level may be set at about 0.6 $V_{dd}$. However, for fast input stage MOS devices, it may be set at about 0.6 $V_{dd}$-x. In another example, for slower input stage MOS devices, it may be set to about 0.6 $V_{dd}$+x.

In various embodiments, the methods and systems for amplifying small optical currents in an optical receiver front end system disclosed herein may be implemented in high performance enterprise servers and routers or, in general, in any type of system that implements optical transmission at high speeds and with small optical currents. In various embodiments, a high-speed optical receiver may include a front end portion comprising multiple transimpedance amplifiers (TIAs) and corresponding feedback control loops. The use of this front end system may allow a high-speed optical receiver to address the issues of small amplitude (AC) and noise that are often associated with signal reception by such an optical receiver.

As described in detail herein, the front end system may employ a main feedback control loop (comprising a main TIA) and a replica feedback control loop (comprising a replica TIA) to generate an optimum input common mode level for a high-speed amplifier that operates at tens of gigabits per second. The replica TIA may track the noise from the optical receiver's power supply ($V_{dd}$) in substantially the same way as the main TIA. Therefore, the differential signals produced by the main control loop are not degraded at the input to a high-speed amplifier that follows. This may result in a smaller noise budget and may reduce photodiode input sensitivities, in some embodiments.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An optical receiver, comprising:
   a photo detector to convert an optical signal into a first electrical current signal;
   a transimpedance amplifier, included in a main feedback control loop, to:
      receive, as input, the first electrical current signal; and
      output a first voltage signal having a first DC component;
   a replica transimpedance amplifier to:
      receive, as input, a second electrical current signal; and
      output a second voltage signal, wherein the first DC component of the first voltage signal and a second DC component of the second voltage signal are substantially equal; and
   a first differential amplifier to:
      receive, as inputs from the transimpedance amplifier and the replica transimpedance amplifier, the first voltage signal and the second voltage signal, respectively; and
      output a pair of output voltage signals that are symmetric about a common mode voltage,
   the main feedback control loop comprising a third differential amplifier to:
      receive, as input signals, the pair of output voltage signals output by the first differential amplifier; and
      amplify the received input signals.

2. The optical receiver of claim 1,
   wherein the optical receiver further comprises a voltage sampler; and
   wherein the pair of output voltage signals output by the first differential amplifier are inputs to the voltage sampler.

3. The optical receiver of claim 1, wherein the transimpedance amplifier and the replica transimpedance amplifier are inverter-based resistive feedback amplifiers.

4. The optical receiver of claim 1, wherein the photo detector comprises a photodiode.

5. The optical receiver of claim 1,
   wherein the replica transimpedance amplifier is included in a replica feedback control loop;
   wherein the replica feedback control loop further comprises a second differential amplifier to:
      receive, as inputs, the output of the replica transimpedance amplifier and a reference voltage.

6. The optical receiver of claim 5, wherein the replica feedback control loop causes a common mode voltage of the output of the replica transimpedance amplifier to match the reference voltage.

7. The optical receiver of claim 5, wherein the value of the reference voltage causes the second differential amplifier to operate in a linear gain region.

8. The optical receiver of claim 5,
   wherein the replica feedback control loop further comprises a transistor to operate as a switch current source; and
   wherein the second electrical current signal is provided by the switch current source.

9. The optical receiver of claim 1, wherein the main feedback control loop causes a DC output of the main control loop to follow the output of the replica transimpedance amplifier.

10. A method of optical communication, the method comprising:
    in a main feedback control loop:
      receiving, by a transimpedance amplifier as input from a photo detector, a first electrical current signal representing an optical signal; and
      outputting, by the transimpedance amplifier, a first voltage signal;
    in a replica feedback control loop:
      receiving, by a replica transimpedance amplifier as input, a second electrical current signal; and
      outputting, by the replica transimpedance amplifier, a second voltage signal, wherein a first DC component of the first voltage signal and a second DC component of the second voltage signal are substantially equal;
    receiving, by a first differential amplifier circuit as inputs from the transimpedance amplifier circuit and the replica transimpedance amplifier circuit, the first voltage signal and the second voltage signal, respectively;
    outputting, by the first differential amplifier circuit, a pair of output voltage signals that are symmetric about a common mode voltage,
    receiving, by a third differential amplifier as inputs, the pair of output voltage signals output by the first differential amplifier; and
    causing the output of the transimpedance amplifier to follow the output of the replica transimpedance amplifier.

11. The method of claim 10, further comprising:
    in a voltage sampler:
      receiving, as input signals, the pair of output voltage signals;
      sampling the input signals; and
      determining, dependent on said sampling, information encoded in the optical signal.

12. The method of claim 10, further comprising:
    in the replica feedback control loop:
      receiving, by a second differential amplifier as inputs, the output of the replica transimpedance amplifier and a reference voltage; and
      causing a common mode voltage of the output of the replica transimpedance amplifier to match the reference voltage.

13. The method of claim 10, wherein the photo detector comprises a photodiode or a phototransistor.

14. The method of claim 10, wherein the transimpedance amplifier and the replica transimpedance amplifier comprise operational amplifiers.

15. A method of designing an optical receiver, the method comprising:
    designing an inverter-based resistive feedback amplifier;
    designing a first differential amplifier to operate at data rates up to multiple gigabits per second;
    designing a second differential amplifier to operate at data rates lower than those at which the first differential amplifier operates;

designing a third differential amplifier to operate at data rates lower than those at which the first differential amplifier operates;

designing a feedback control loop comprising the inverter-based resistive feedback amplifier, the first differential amplifier, and the second differential amplifier; and designing a replica feedback control loop comprising a replica of the inverter-based resistive feedback amplifier and the third differential amplifier;

wherein an output of the inverter-based resistive feedback amplifier and an output of the replica of the inverter-based resistive feedback amplifier are inputs to the first differential amplifier; and wherein the feedback control loop is designed such that, once settled, it causes the output of the inverter-based resistive feedback amplifier to follow the output of the replica of the inverter-based resistive feedback amplifier, the designing the replica feedback control loop comprises:
choosing a common mode selector reference voltage for input to the third differential amplifier; and the replica feedback control loop is designed such that, once settled, it causes a common mode voltage of the output of the replica of the inverter-based resistive feedback amplifier to match the common mode selector reference voltage.

16. The method of claim 15, further comprising:
determining whether the feedback control loop is stable over a wide range of processes, voltages, temperatures, and common mode selector reference voltages; and in response to determining that the feedback control loop is not stable over a wide range of processes, voltages, temperatures, or common mode selector reference voltages, modifying the design of the feedback control loop to improve stability, wherein modifying the design comprises modifying a structure, an input, or an operating parameter of one or more of the inverter-based resistive feedback amplifier, the first differential amplifier, or the second differential amplifier.

17. The method of claim 15, further comprising:
determining whether the replica feedback control loop is stable over a wide range of processes, voltages, temperatures, and common mode selector reference voltages; and in response to determining that the replica feedback control loop is not stable over a wide range of processes, voltages, temperatures, or common mode selector reference voltages, modifying the design of the replica feedback control loop to improve stability, wherein modifying the design comprises modifying a structure, an input, or an operating parameter of one or more of the replica of the inverter-based resistive feedback amplifier or the third differential amplifier.

* * * * *